United States Patent [19]
Rao et al.

[11] Patent Number: 5,114,530
[45] Date of Patent: May 19, 1992

[54] INTERLEVEL DIELECTRIC PROCESS

[75] Inventors: Kalipatnam V. Rao, Plano; Allan T. Mitchell, Garland; James L. Paterson, Richardson, all of Tex.

[73] Assignee: Texas Instruments Incorporated, Dallas, Tex.

[21] Appl. No.: 552,369

[22] Filed: Jul. 16, 1990

Related U.S. Application Data

[63] Continuation of Ser. No. 249,795, Sep. 27, 1988, abandoned, which is a continuation of Ser. No. 793,593, Oct. 31, 1985, Pat. No. 4,799,992.

[51] Int. Cl.$^5$ ............................................. H01L 21/00
[52] U.S. Cl. ...................... 156/653; 156/652; 156/656; 156/657; 156/663; 437/187; 437/235; 437/245
[58] Field of Search .............. 156/662, 663, 659.1, 156/653, 654, 657, 656, 651, 655; 437/228, 187, 245, 235

[56] References Cited

U.S. PATENT DOCUMENTS

| | | |
|---|---|---|
| 4,356,040 | 10/1982 | Fu et al. |
| 4,451,326 | 5/1984 | Gwozdz. |
| 4,476,621 | 10/1984 | Bopp et al. |
| 4,492,008 | 1/1985 | Anantha et al. ............ 437/54 |
| 4,507,171 | 3/1985 | Bhatia et al. ............ 437/69 |
| 4,518,629 | 5/1985 | Jeuch. |
| 4,572,765 | 2/1986 | Berry ............ 437/20 |
| 4,590,663 | 5/1986 | Haken. |
| 4,659,427 | 4/1987 | Barry et al. |
| 4,707,218 | 11/1987 | Giammarco et al. ............ 437/65 |
| 4,786,609 | 11/1988 | Chen ............ 437/44 |

OTHER PUBLICATIONS

Adams et al., "Planarization of Phosphorous-Doped Silicon Dioxide", J. Electrochem. Soc. (Feb. 1981) pp. 423-429.

*Primary Examiner*—David A. Simmons
*Assistant Examiner*—Thi Dang
*Attorney, Agent, or Firm*—James C. Kesterson; B. Peter Barndt; Richard L. Donaldson

[57] ABSTRACT

A process for the fabrication of integrated circuits, wherein the interlevel dielectric material is partially etched back prior to reflow. This provides a pre-reflow profile which prevents filament problems in subsequently-patterned conductor levels, and which also avoids cracking of the interlevel dielectric during reflow.

8 Claims, 2 Drawing Sheets

INTERLEVEL DIELECTRIC PROCESS

This application is a continuation of application Ser. No. 07/249,795, filed Sept. 27, 1988, now abandoned, which is a continuation of application Ser. No. 06/793,593, filed Oct. 31, 1985, now U.S. Pat. No. 4,799,992.

BACKGROUND AND SUMMARY OF THE INVENTION

The present invention relates to fabrication of integrated circuits.

All useful integrated circuits need to have more than one level of conductor. Some sort of interlevel dielectric is therefore necessary to separate these layers from each other, and such interlevel dielectrics are used in a tremendous variety of integrated circuit processes: NMOS, CMOS, I-squared-L, ECL, ALS, high voltage, smart power, memory, logic, analog, gate arrays, and many other families of integrated circuits all have their own particular processing and interconnect demands, but all typically use multiple patterned overlaid layers of thin-film conductors, and all accordingly need to use interlevel dielectrics to separate these conductor layers. The present invention provides an improvement in the conventional processes which is applicable nearly anywhere that interlevel dielectrics are used.

For example, in conventional NMOS technology a polysilicon thin film will be patterned to provide a first level of interconnect (and also transistor gates). A relatively thick layer of a doped silicate glass (such as phosphosilicate glass ("PSG") or borophosphosilicate glass ("BPSG")) will be deposited over this conductor level to provide the first interlevel dielectric. (This layer is also often conventionally referred to as "MLO", or multi-level oxide, although it is not a pure oxide.) Contact holes are patterned in locations which will permit the following metal layer to make electrical connections between transistors in the substrate and/or polysilicon lines. Any implant which is needed for the contact locations (e.g. to assure good ohmic contact) is done at this time, and then the interlevel dielectric is reflowed. "Reflow" means that this glass is heated to a high enough temperature that surface tension effects cause its surface to smooth out. This not only gives the glass a fairly smooth surface, but also causes its sidewalls next to the contact holes to be fairly gently sloped. Similarly, the places where the patterned polysilicon under the glass has vertical edges will not cause as sharp an edge at the upper surface of the glass: where the underlying polysilicon has a sharp edge, the glass will have a smoother slope.

These smoothing effects are highly desirable, because they permit good coverage by the overlying conductor levels. That is, in this conventional process, after the reflow process a metal (such as aluminum) will be deposited (e.g. by sputtering) and then patterned. The etch which patterns the metal layer needs to be anisotropic, to keep good control over the linewidth of this layer; but, when such anisotropic etching is used, problems can occur where the metal runs over an uneven surface. Where the metal lies on a slope (even a very narrow and localized slope), this portion of the metal will take longer to etch away than the metal on flat areas will. The steeper and higher the slope is, the more overetching time will be required; but the underlying structures will not be totally inert to the etch used to cut the metal layer, and too much overetching can damage them. Thus it is desirable not to use more overetch than is necessary to reliably remove all of the unwanted metal; but if the surface under the metal has any local slope which is steeper or higher than anticipated, the amount of overetching may suddenly turn out to be insufficient to remove all of the metal. In this case, portions of metal may remain as narrow lines running along the more steeply sloped portions of the underlying surface; such unwanted lines are known as filaments, and the prevention of filaments is consistently one of the major objectives (and often one of the major problems) in developing a process for patterning conductors, since such filaments can of course short out whatever circuit is sought to be fabricated, or introduce large amounts of unexpected parasitic capacitance, or have other adverse effects on the functionality of the circuit being fabricated.

Thus, control of the surface topography of the interlevel dielectric is critical to control of subsequent processing steps, and particularly to the avoidance of filaments in the patterning of overlying conductors.

A related problem in the prior art of interlevel dielectrics is separation of the dielectric during reflow. That is, where the MLO 10 is deposited over conductor lines 16 which are spaced apart by a certain critical distance, the as-deposited MLO 10 is likely to have a fairly steep valley 13 in its surface between the conductors 16, as shown in FIG. 3A. However, the surface tension effects during reflow may cause the MLO to separate rather than coalesce at the location of this valley 13, so that the pre-reflow valley 13 is converted into a crack 14 which cuts right through the reflowed MLO 12 (as shown in FIG. 3B), which of course can destroy the functionality of the circuit.

Another criterion for interlevel dielectrics is reduction in parasitic capacitance. The capacitance between the two conductor levels which are separated by the interlevel dielectric can be a significant component of the distributed capacitance which increases the RC time constant (and therefore degrades the propagation speed) of the conductor. Such parasitic capacitances may also be pattern-dependent, and can therefore throw a designer's modelling of his circuit completely off.

The present invention advantageously solves these problems, and provides other advantages as well, by controlling the profile of the interlevel dielectric prior to reflow. The interlevel dielectric is deposited to a thickness significantly greater than needed, and then etched back to the desired thickness. This results in a profile which is similar to that which might have been achieved by deposition of sidewall oxide filaments on the underlying conductor before the interlevel dielectric is deposited. Thus, the interlevel dielectric profile over the edges of the underlying topography is gentler before reflow than in the prior art methods, and the result is that the interlevel dielectric profile over the edges of the underlying topography is also gentler after reflow than in the prior art methods.

Another way of regarding the advantages of this process is to consider that the profile of the reflowed interlevel dielectric is less sensitive to the topography of the underlying layer: that is, the sensitivity to process and design variations has been decreased. The risk of filament formation has been greatly decreased, and the reliability of any process using multiple conductor layers can therefore be increased.

Another advantage of the present invention is that thinning of the dielectric near the upper corners of the underlying patterned conductor layer is decreased. This occurs because extra interlevel dielectric material is present in close proximity to these corners before reflow, so not as much of the lateral transport of material (which normally occurs during reflow, as shown by arrows in FIGS. 2 and 4, to partially fill up the low points adjacent to a high point) is drawn from the material above these corners. Moreover, the total volume of material before reflow near an edge of the underlying conductor is greater than in the prior art, and therefore the average thickness of the interlevel dielectric material after reflow will also be greater in this region. The parasitic capacitance between the underlying and overlying levels of conductors is particularly sensitive to the thickness of the dielectric near the corners of the underlying conductor, because of the geometry-dependent electric-field increase at corners. Thus, the increased thickness of interlevel dielectric at the corners of the patterned conductor means that parasitic capacitance between the underlying and overlying levels of conductors is reduced, which is highly desirable as discussed above.

Another advantage of the present invention is that the problem of separation of the dielectric during reflow is avoided. The present invention provides additional interlevel dielectric material, so that, instead of deep valleys 13 as shown in the prior art structure of FIG. 3A, shallower valleys 13' are formed, as shown in FIG. 3C, and the disastrous cracks 14 shown in FIG. 3B never occur.

Another way of exploiting the improved dielectric coverage provided by the present invention is to reduce the average thickness of the dielectric over flat areas. That is, for a given average thickness of the dielectric over flat areas, the present invention provides improved dielectric thickness at upper edges; and, if not all of this additional thickness at upper edges is needed, it may be possible to reduce the average thickness of the dielectric over flat areas while still preserving adequate dielectric thickness at upper edges. This may also be advantageous for various reasons, including relaxed constraints on the contact hole profiles.

Thus, a further advantage of the present invention is improved contact resistance. As seen in FIG. 5, the prior art will often restrict the conduction path adjacent to the contact to a very thin lamina around the sidewalls of the contact hole. This will increase the total series resistance of the contact somewhat, and will also decrease reliability (since electromigration effects may occur in the region of high current density). By use of the present invention, a contact cross-section as shown in FIG. 6 can be achieved instead, wherein the high-current density regions are avoided; this reduces contact series resistance and helps reliability.

Another way to regard the advantages of this class of embodiments is that the sensitivity of contact quality to contact hole profiling is reduced. That is, by reducing the total height of interlevel dielectric through which the contact hole must be cut, the chance that any steep portion of the contact hole sidewall will be high enough to cause step coverage problems is reduced.

A technique which is known in the prior art is planarization of the interlevel dielectric, using techniques such as resist etchback. (See, for example, the Adams and Capio paper in volume 128 of the Journal of the Electrochemical Society at page 423 (1981), which is hereby incorporated by reference.) However, the present invention is quite different from such techniques. For one thing, the present invention does not in fact planarize the interlevel dielectric, but merely modifies its profile while leaving it somewhat non-planar. That is, interlevel dielectric planarization will leave the interlevel dielectric substantially thicker over contacts to substrate than over contacts to polysilicon, and this means that, during the contact etching step, a very large amount of overetch will occur at the locations of contacts to polysilicon while the extra thickness over the contacts to substrate is being cleared. Avoidance of ill effects due to this local overetch requires additional process modifications and/or places additional constraints on processing. Moreover, dielectric planarization is normally not used in combination with reflow, and thus it is necessary either to use some other process to profile the contact sidewalls, or else to use some method of metal deposition which permits metal to form durable low-resistance connections along the nearly vertical sidewalls of the contact hole. (There is no inherent barrier to using reflow with planarization, but no use or teaching of this in the prior art is known to the inventors.) Again, these needs require additional process modifications and/or place additional constraints on processing.

The prior art has discussed the use of sidewall oxides at the polysilicon level: among the several motivations put forth for this have been increased dielectric thickness near the upper corners of the polysilicon lines, and generally smoother topography. See, for example, U.S. Pat. Nos. 4,234,362 to Riseman and 4,356,040 to Chatterjee et al. (TI-7379), and U.S. patent application Ser. No. 469,074 (filed Feb. 23, 1983)(TI-9455), which are hereby incorporated by reference. Thus, some of the advantages of the present invention can alternatively result from the prior art methods for formation of a separate sidewall oxide under the interlevel dielectric; formation of such a separate sidewall oxide is convenient in some processes but not in others, but the present invention is applicable to nearly any process which uses multiple layers of patterned thin-film conductors. Formation of a separate sidewall oxide requires an additional deposition step together with a timed etch of approximately 110%, so that control of the etch rate in this timed etch must be quite sensitive; but profile-modification of the interlevel dielectric in accordance with the present invention does not require any additional deposition, and requires a much less sensitive etchback step. Thus, the process of the present invention has the advantage of increased process simplicity and reproducibility over the prior art methods of forming a separate sidewall oxide underneath the interlevel dielectric. Moreover, the prior art methods of forming a separate sidewall oxide underneath the interlevel dielectric are not applicable to as many processes as the present invention is.

For example, one particularly advantageous application of the present invention is in EPROM or EEPROM designs where a thick stack (of, e.g., two layers of polysilicon or silicide separated by a thin composite dielectric) is etched to have vertical sidewalls, and these stacks are laterally separated by a distance which may be nearly as small as their thickness. Under these circumstances, reliable formation of separate sidewall oxides on the stack would be difficult, unless the sidewall oxides were significantly less high than the stack, in which case many of the advantages of the sidewall oxides would be reduced. In fact, one difficulty of separate sidewall oxides generally is that they must be formed to have a height somewhat less than the height of the sidewall they adjoin, if the flat areas are to be cleared reliably. However, the present invention always provides a profile equivalent to an underlying sidewall oxide having 100% of the height of its adjacent sidewall, which is not possible with separately formed sidewall oxides. This is another advantage of the present invention.

The present invention is also particularly advantageous in the formation of interconnect structures in bipolar integrated circuits.

According to the present invention there is provided: A process for fabricating integrated circuits, comprising the steps of: providing a partially fabricated integrated circuit having a first patterned conductor layer thereon; depositing an interlevel dielectric overall; anisotropically etching said interlevel dielectric to reduce its minimum thickness by at least 10 percent; opening contact holes in said interlevel dielectric at a plurality of predetermined locations; and forming a second patterned conductor layer in a predetermined pattern.

BRIEF DESCRIPTION OF THE DRAWINGS

The present invention will be described with reference to the accompanying drawings, wherein.

DESCRIPTION OF THE PREFERRED EMBODIMENTS

The present invention provides broadly applicable new concepts in semiconductor processing. A sample class of NMOS embodiments will be discussed in great detail, but it must be appreciated that the novel concepts which are included in these embodiments could also be used in many other embodiments, and the scope of the invention is not delimited by the particular examples shown.

Figure 1:
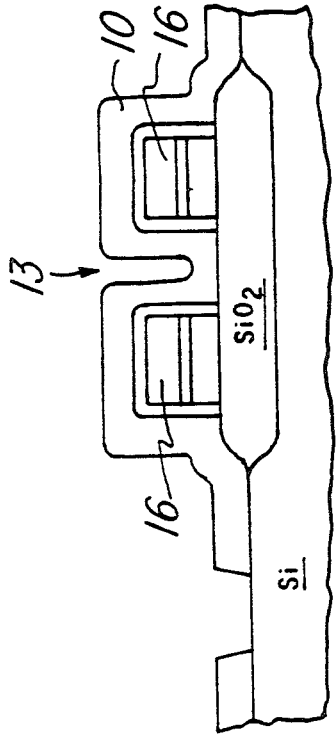
FIGS. 1 and 2 show two different embodiments of the invention, where partial etchback of the interlevel dielectric is used without and with reflow.
Figure 3A:
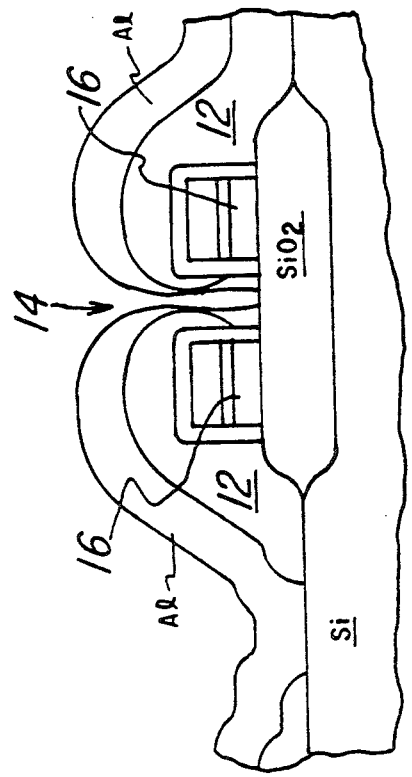
FIG. 3A shows the profile of as-deposited interlevel dielectric prior to reflow in the prior art.

FIG. 1 shows one sample embodiment of the invention. A silicon substrate 22 is separated from a patterned stack 24 (including a first polysilicon layer, a poly-to-poly dielectric, and a second polysilicon layer, all not separately shown) by a gate dielectric 25. The height of the stack 24 is, for example, 1100 nm. A BPSG (borophosphosilicate glass) layer 26 is deposited to a thickness of 1000 nm, and then anisotropically etched back to a thickness of 700 nm.

This etchback is performed as a timed etch, but it is reasonably insensitive to a moderate degree of overetching or underetching. For example, a 20% underetch means that the resulting thickness of the interlevel dielectric before reflow would be about 760 nm instead of 700 nm, which is not likely to be a disastrous difference. Normal oxide/PSG etch chemistries can be used.

The silicate glass layer 26 is preferably deposited by atmospheric chemical vapor deposition (CVD); the phosphorus content of this glass may be less than the desired final level, since it may be increased during the reflow step, as will be discussed below.

The silicate glass layer is preferably then densified, as is conventional, e.g. by heating it in an atmosphere of argon at 900 degrees C. for 15 minutes.

After densification, contact holes can be cut (and an implant performed if desired to assist in ohmic contact formation). Any steps necessary to profile the contacts can then be optionally performed, and the overlying metal interconnect layer can be deposited and patterned.

Figure 2:
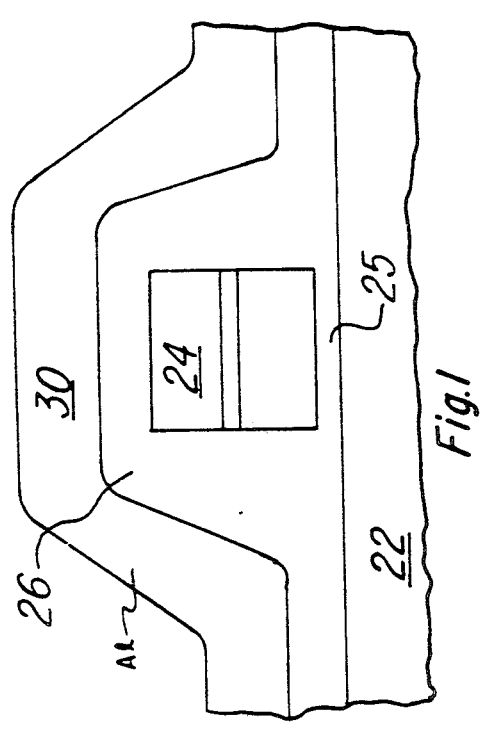
Figure 3B:
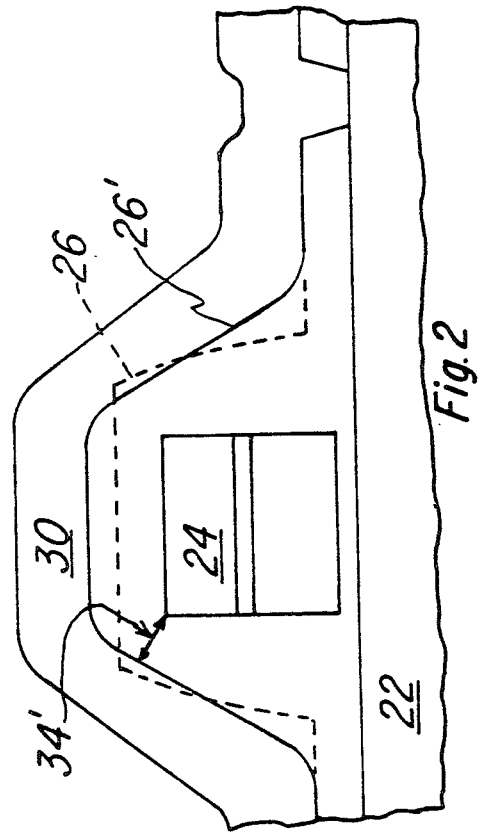
FIG. 3B shows the disastrous interlevel dielectric separation which will result (after reflow) from the structure of FIG. 3A, but not from the structure of FIG. 3C.
Figure 5:
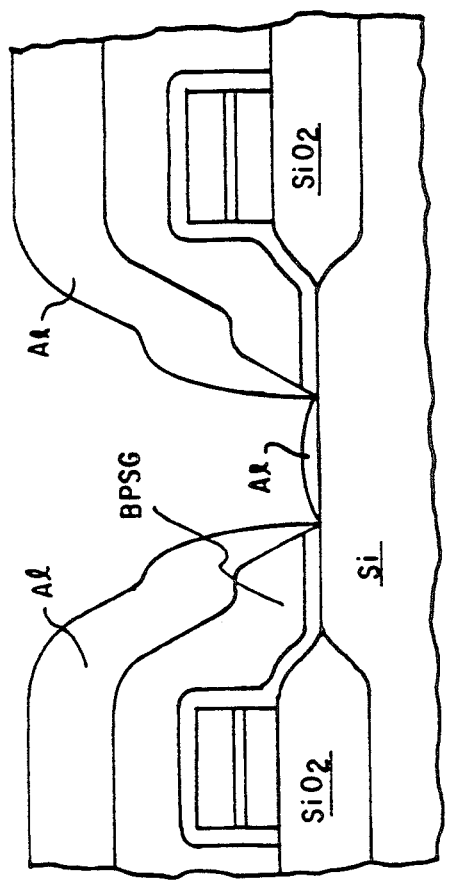
FIG. 5 shows a cross-section of the metal coverage at a contact to moat in the prior art.
Figure 6:
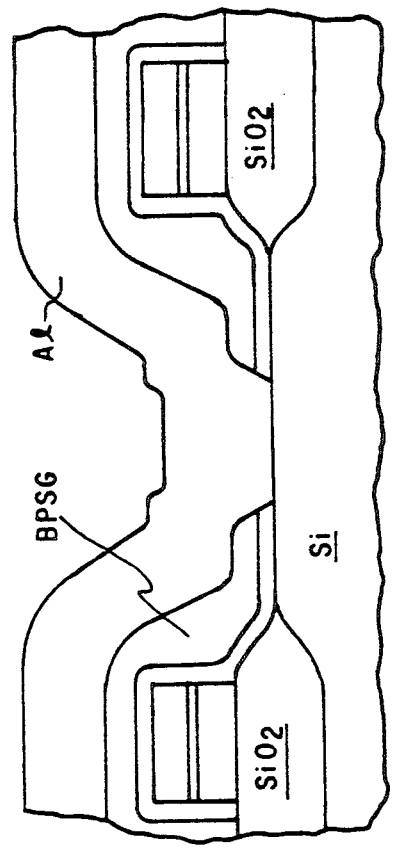
FIG. 6 shows a cross-section of the metal coverage at a contact to moat in a structure fabricated using the present invention.
Figure 3C:
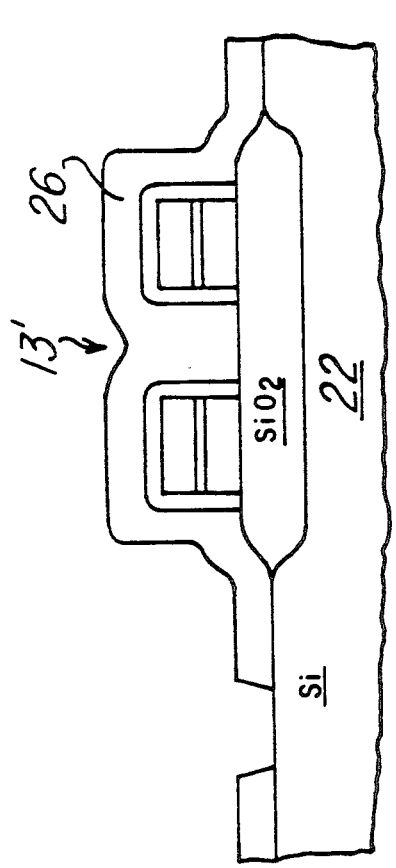
FIG. 3C shows the corresponding profile when using the present invention.

This embodiment results in formation of a structure such as shown in FIG. 1. However, the embodiment shown in FIG. 2 is presently more preferred. In this embodiment, reflow is used after etchback of the interlevel dielectric. In this figure, the dotted line 26 shows the profile of the interlevel dielectric after deposition and etchback, and the solid line 26' shows the profile of the interlevel dielectric after reflow.

Reflow is performed after the contact holes 28 have been cut. Besides profiling the contact hole sidewalls, this step will smooth out the profile of the interlevel dielectric over the stack 24, as shown by the difference between profiles 26 and 26'.

Reflow may be performed, for example, using 12 minutes at 950° C. Optionally, phosphorus oxychloride may be introduced during this high-temperature step, to increase the phosphorus content of the interlevel dielectric.

Subsequently, a cleanup step to prepare the surface can be followed by sputter deposition of aluminum, by metal patterning, and by other known steps as desired.

Figure 4:
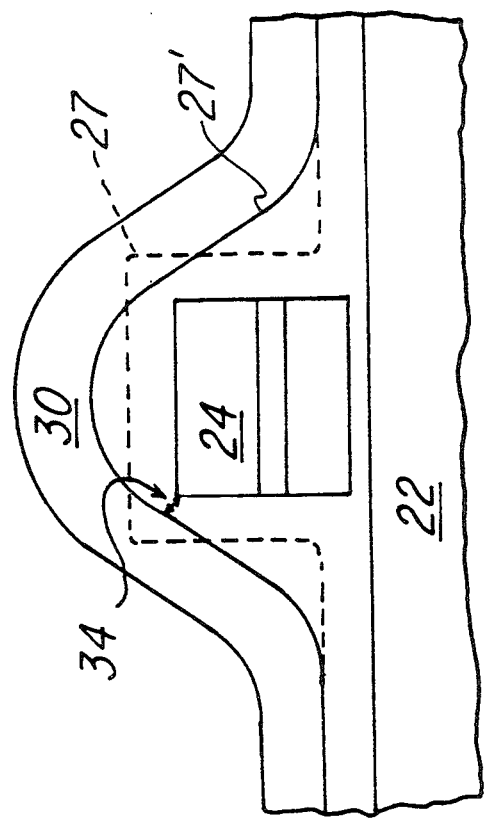
FIG. 4 shows a prior art structure corresponding to that of FIG. 2, which fails to achieve the advantages of the structure of FIG. 2.

FIG. 4 shows a prior art structure corresponding to that of FIG. 2, which fails to achieve the advantages of the structure of FIG. 2. Note that the dimension 34' of FIG. 2 is larger than the dimension 34 of the prior art structure of FIG. 4: that is, the prior art profile 27 of as-deposited interlevel dielectric produces a reflowed profile 27' with a minimum thickness shown as dimension 34 at the corner of the stack 24, whereas the present invention provides a profile 26 of as-deposited interlevel dielectric, which produces a reflowed profile 26' having a minimum thickness dimension 34' which is greater than the minimum thickness dimension 34 of a prior art structure (for a given thickness of the stack 24 and a given pre-reflow thickness of the dielectric).

It should be noted that the example just described has been aimed at fabrication of a polysilicon-to-metal dielectric, but the teachings of this embodiment can be directly adapted to metal-to-metal interlevel dielectric, or to poly-to-poly, or to other structures as desired. The teachings of the present invention can be used in MOS, bipolar, or other classes of silicon integrated circuit processing. It is also not limited to silicon integrated circuits, but is perfectly well applicable to III–V or other integrated circuits.

The preferred embodiment uses BPSG, but of course many other silicate glasses (which may be doped with germanium or other elements in addition to phosphorus) may be used instead. Moreover, a plasma-deposited oxide may be used instead of CVD material as starting point for the dielectric.

It should also be noted that the present invention is not by any means limited to use with silicate glasses, but is perfectly applicable to other dielectrics. For example, use of the present invention with organic interlevel dielectrics (such as polyimides, PIQ, or the many others which have been discussed in the literature) may be particularly advantageous. Reflow of silicate glasses, even with the new glass compositions recently introduced, is still a high-temperature step late in the processing sequence, and the general trend of development is to try to reduce late high-temperature steps. However, organic or silicone polymer dielectrics may offer the potential for reflow (or analogous surface-tension-related smoothing processes) at lower temperatures, which would make reflow more desirable; and, as noted above, partial etchback of the interlevel dielectric according to the present invention is particularly advantageous in the context of a process which also includes reflow.

Thus, the present invention provides all of the advantages listed above, and others besides. The present invention can be very widely modified and varied, and its scope is not limited except as specified in the claims.

What is claimed is:

1. A method for fabricating an integrated circuit on a substrate having topographical features including at least two closely adjacent raised areas defining a low area therebetween, comprising the steps of:

depositing a dielectric layer over the surface of said substrate so as to fill said defined low area to a thickness greater than a selected thickness and to cover said raised areas to a thickness greater than said selected thickness;

anisotropically etching said dielectric layer such that the thickness of said dielectric layer covering at least one of said raised areas is reduced to a thickness equal to said selected thickness, and the thickness of said dielectric layer covering said defined low area remains greater than said selected thickness;

removing selected portions of said dielectric layer to provide vias; and depositing and patterning a conductive layer, said conductive layer extending into said vias to contact components in said substrate.

2. A method as claimed in claim 1 wherein said substrate comprises crystalline silicon.

3. A method as in claim 1 wherein said dielectric layer is deposited conformally on said substrate.

4. A method as in claim 1 wherein said dielectric layer is selected from the group of silicate glasses, organic dielectrics and silicone polymer dielectrics.

5. A method as in claim 1 wherein said conductive layer comprises aluminum.

6. The method of claim 1 wherein said anisotropically etching step does not penetrate said dielectric layer.

7. A method for fabricating an integrated circuit on a substrate having topographical features including at least two closely adjacent raised areas defining a low area therebetween, comprising the steps of:

depositing a dielectric layer over the surface of said substrate so as to fill said defined low area to a thickness greater than a selected thickness and to cover said raised areas to a thickness greater than said selected thickness; and anisotropically etching said dielectric layer such that the thickness of said dielectric layer covering at least one of said raised areas is reduced to a thickness equal to said selected thickness, and the thickness of said dielectric layer covering said defined low area remains greater than said selected thickness and continues to substantially fill said defined low areas.

8. The method of claim 7 and further comprising removing selected portions of said dielectric layer to provide vias.

* * * * *